United States Patent [19]
Navarro

[11] 4,406,062
[45] Sep. 27, 1983

[54] METHOD OF FORMING A MULTICHANNEL CONNECTOR

[75] Inventor: John N. Navarro, Pasadena, Calif.

[73] Assignee: Thomas & Betts Corporation, Raritan, N.J.

[21] Appl. No.: 298,429

[22] Filed: Sep. 1, 1981

Related U.S. Application Data

[62] Division of Ser. No. 90,936, Nov. 5, 1979, abandoned.

[51] Int. Cl.³ ............................................. H01R 43/04
[52] U.S. Cl. ....................................... 29/881; 29/847; 339/17 F; 427/271
[58] Field of Search ................ 29/828, 831, 846, 847, 29/857, 863, 881, 884, 885, 868, 869; 427/271, 276, 277; 339/17 F, 176 MF

[56] References Cited

U.S. PATENT DOCUMENTS

| | | | |
|---|---|---|---|
| 1,290,153 | 1/1919 | Fitzpatrick | 339/98 |
| 2,962,393 | 11/1960 | Ruckelshaus | 427/276 X |
| 3,309,645 | 3/1967 | Noschese | 339/98 |
| 3,434,093 | 3/1969 | Wedekind | 339/17 |
| 3,444,506 | 5/1969 | Wedekind | 339/99 |
| 3,745,509 | 7/1973 | Woodward et al. | 339/17 F |
| 3,816,818 | 6/1974 | Meier et al. | 339/99 R |
| 3,930,708 | 1/1976 | Wedekind et al. | 339/99 R |
| 4,077,695 | 3/1978 | Bakermans | 339/176 MF |
| 4,289,384 | 9/1981 | Samek | 29/847 X |

FOREIGN PATENT DOCUMENTS

| | | | |
|---|---|---|---|
| 2742900 | 7/1978 | Fed. Rep. of Germany | 339/176 MF |
| 699856 | 11/1953 | United Kingdom | 339/98 |

Primary Examiner—Francis S. Husar
Assistant Examiner—Carl J. Arbes
Attorney, Agent, or Firm—Robert M. Rodrick; Salvatore J. Abbruzzese; Jesse Woldman

[57] ABSTRACT

A connector for joining the conductors of a multiconductor cable to a like plurality of conductors formed of an insulating base member having an equal plurality of conductive channels therein, each channel insulated from each of the remaining channels. The conductors of the cable are distributed, one for each channel, into the channels and a like number of selectively formed conductors are simultaneously distributed among the channels with their ends separated from the ends of the cable conductors. An insulating cover, of sufficient dimensions to overlie and contact each conductor, is attached to the base member to compress all conductors therebetween. A complete conductive path is established for each cable conductor and its associated conductor by means of the conductive channel.

14 Claims, 9 Drawing Figures

METHOD OF FORMING A MULTICHANNEL CONNECTOR

This is a division of application Ser. No. 90,936, filed Nov. 5, 1979 now abandoned.

BACKGROUND OF THE INVENTION

1. Field of the Invention

The invention is employed wherever multiconductor cables are to be joined to like members of conductors as in the interconnection of the conductors of a multiconductor flat cable to a printed circuit board.

2. Description of the Prior Art

In the prior art it was necessary to align all of the traces on a printed circuit board so that conductive pads or plated through holes had a fixed pitch to accept a multiconductor flat cable connector directly or through an intermediate device such as a header or DIP socket. One such device is shown in U.S. Pat. No. 3,964,816 issued June 22, 1976 to Ronald S. Narozny, entitled "Electrical Contact" and assigned to the assignee of the instant invention. The limitation on the pitch of the conductors of the cable is the physical size and spacings required for the in-line contacts of such connector. There is no requirement that the traces be aligned or that they be set in any fixed pattern. The most economical use of connector area to this point has been to place all in alignment and limit the number of conductors to be joined by the connector size that would permit direct in-line connections between the conductors and the traces.

SUMMARY OF THE INVENTION

The instant invention overcomes the difficulties noted above with respect to prior art connectors by providing a connector to match the pitch of the conductors of a multiconductor flat cable to the traces of a printed circuit board without requiring that the pitches of each member be the same. A base member is formed with a plurity of conductive channels into which the bared ends of the conductors of the flat cable are placed. A series of bared conductors are placed in the opposite ends of the channels separated from the first conductors. These conductors may be formed to any desired pitch and may be temporarily supported in a carrier prior to closure of the connector to retain them in their formed predetermined condition. An insulating cover member, of dimensions sufficient to overlie the entire base member, is fastened to the base member to place all the conductors in compression and assure a good electrical path between the conductors in each channel via the conductive channel alone.

The connector can be produced by machining a series of V-grooves into one surface of an insulating base and covering the entire V-grooved surface with a conductive layer. The apexes of the V-grooves are now machined off to provide a series of isolated conductive V-groove channels. An insulating cover, dimensioned to overlie the entire base and arranged to be fastened to the base to apply a compressive force to the conductors is placed therein. It is an object of this invention to provide an improved multichannel connector.

It is another object of this invention to provide an improved connector where the pitch of a multiconductor cable can be matched to a different pitch.

It is another object of the invention to provide a multichannel connector fabricated from a single base member and cover member.

It is still another object of the invention to provide a simple multichannel connector wherein all connections are made in individual conductive channels.

Other objects and features of the invention will be pointed out in the following description and claims and illustrated in the accompanying drawings, which disclose, by way of example, the principles of the invention and the best mode which has been contemplated for carrying it out.

DESCRIPTION OF THE PREFERRED EMBODIMENTS

Figure 1:
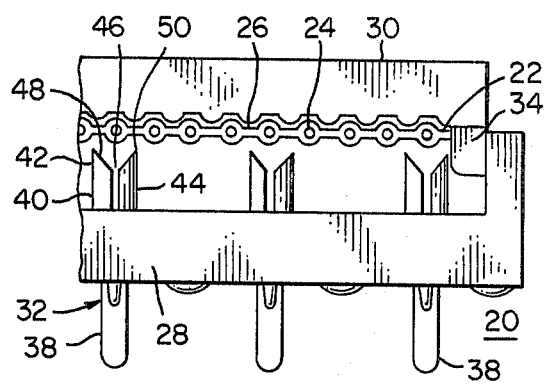
FIG. 1 is a connector according to the prior art and is FIG. 2 of the above-identified U.S. Pat. No. 3,964,816 issued June 22, 1976.
Figure 2:
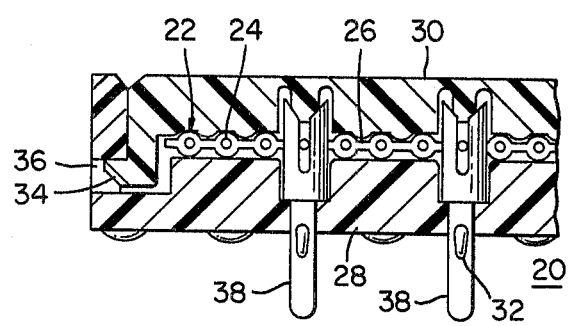
FIG. 2 is a further view of the connector of FIG. 1 and is FIG. 3 of the cited prior art patent.

Referring to FIGS. 1 and 2, a typical prior art connector 20 is shown with a single, aligned row of contacts 32 having a pitch to match the individual conductors 24 of flat cable 22. The contact tails 38 of the contacts 32 are arranged to be inserted into the plated through apertures in the traces on a printed circuit board (not shown) directly or via a DIP socket (not shown) connected to the traces. The traces will also be in a single, aligned row parallel with an edge of the printed circuit board. The limiting factor in interconnect density for such arrangements is the required spacings of the traces to prevent crosstalk between signals on the traces and the physical size and spacings of the contacts within the connecotr and the necessity that all terminations be along a single aligned row.

Figure 3:
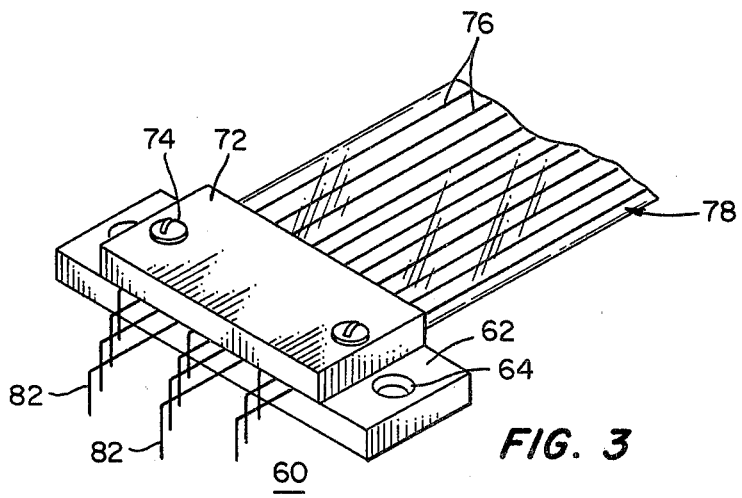
FIG. 3 is a perspective view of a connector constructed in accordance with the concepts of the invention assembled to a multiconductor cable and a plurality of individual conductors.
Figure 4:
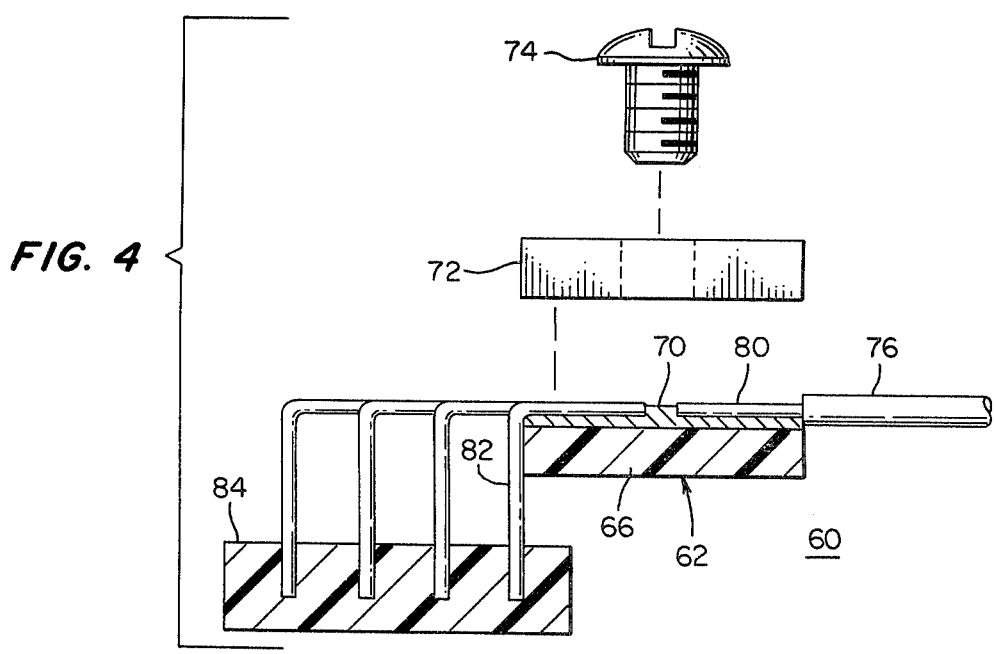
FIG. 4 is an exploded side elevational view, partly in section, of the connector of FIG. 3.
Figure 5:
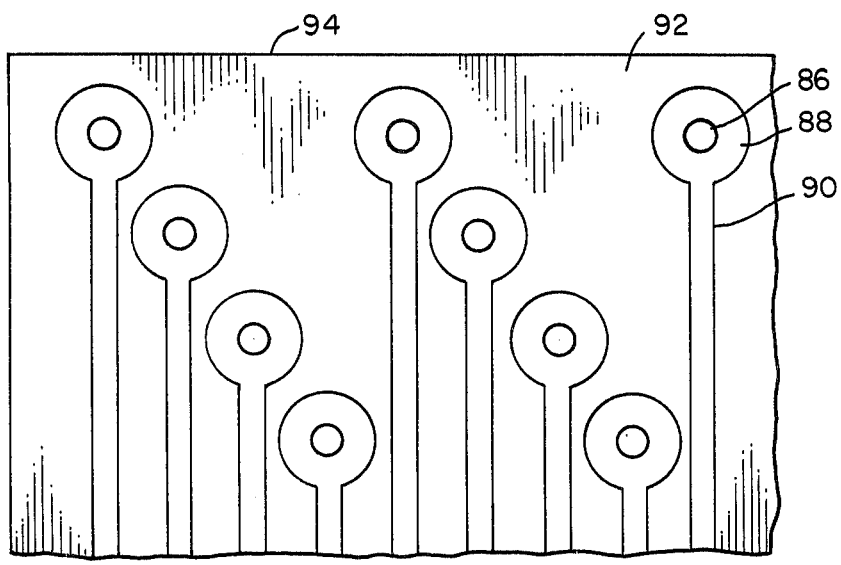
FIG. 5 is a top plan view of the modified traces on a printed circuit board employed with the connector of the instant invention.
Figure 9:
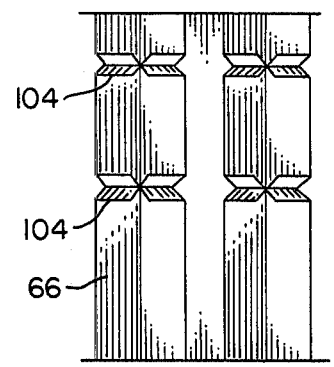
FIG. 9 is a top view of a modification of the connector of FIG. 3.

Turning now to FIGS. 3 to 5, there is shown a connecotr 60 constructed in accordance with the concepts of the invention and which permits the coupling of the individual conductors of a multiconductor flat cable to the traces of a printed circuit board arranged to minimize the spacings therebetween and distribute them at a pitch and arrangement better suited to the printed circuit board. The connector 60 has a base member 62 containing, adjacent its ends, apertures 64 for the receipt therein of fasteners (not shown) to anchor the base member 62 to a printed circuit board or the like. As can be best seen in FIG. 8, a series of V-grooves 66 are placed in base member 62, each groove 66 being electrically isolated and insulated from its adjacent V-grooves 66 by an insulating band 68. A conductive layer 70 is placed within each V-groove to provide a conductive channel for conductors placed therein, as will be described below. An insulating cover member 72, of dimensions sufficient to overlie the conductors placed in the V-grooves 66 of the base member 62, is placed over the base member 62 and fastened therto by fasteners 74 so that conductors placed between the base member 62 and the cover member 72 can be forced into intimate engagement with conductive layer 70 to provide a good electrical joint therebetween.

To use the connector 60 to electrically join the individual conductors 76 of a flat conductor cable 78 to a series of individual conductors 82, it is necessary that the ends of conductors 76 and 82 be bared. As is shown in FIG. 4, a portion of conductor 76 is bared as at 80 while conductor 82 is a length of bare conductor. It is understood that conductors 82 could also be the conductors of a flat cable similarly bared at its end. The bared ends 80 of the conductors 76 are placed in the V-grooves 66 and held there, by, for example, clamp means (not shown) until assembly of the connector 60 is complete. The conductors 82 are next introduced into the V-grooves 66 with the ends thereof spaced from the ends thereof spaced from the ends of the associated conductors 76 placed in the same grooves 66. The conductors 82 may be preformed to particular patterns based upon their intended use and held in such preform condition by a disposable, temporary carrier 84. The cover member 72 is now positioned over the base member 62 by the fasteners 74 at which time the clamp used to hold cable 78 may be released and the carrier 84 disposed of. The connector 60 can now be moved to the printed circuit board and attached thereto with fasteners (not shown) placed in apertures 64 in base member 62. The free ends of the conductors 82 can now be placed in the plated through apertures 86 in the enlarged areas 8 of the traces 90 and soldered to the underside of the printed circuit board 92.

As can be seen from FIG. 5, the plated through holes 86 are arranged along a plurality of parallel axes, each acutely angled with respect to printed circuit board 92 edge 94 rather than along a single, aligned row parallel with edge 94, as is common in the prior art. This arrangement allows the traces 90 to be placed on closer centers than would be possible if correct spacing of the enlarged areas 88 were maintained along a single line. In addition to increased trace density, it is also possible to make connections directly to components upon the printed circuit board 92 without bringing their leads to the board edge via traces such as 90. Thus, the pitch of the conductors 76 of the cable 78 can be rearranged as desired by the connector 60 to suit the arrangement upon the printed circuit board 92 without the rigid one-to-one relationship existing in the prior art devices.

Figure 6:
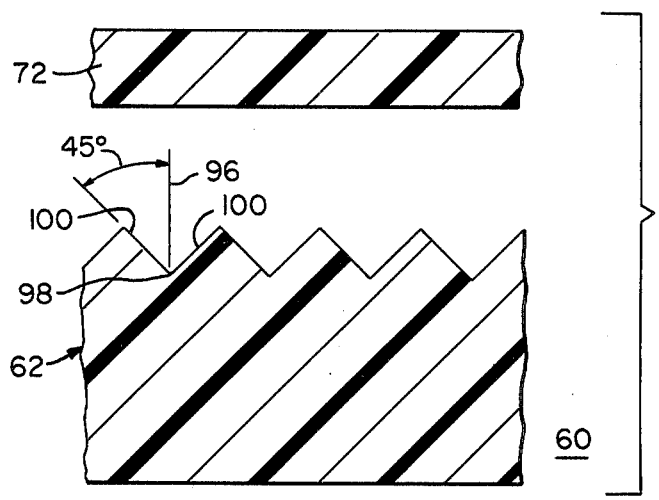
FIGS. 6 to 8 are side elevational views of the connector in its various steps of fabrication.
Figure 7:
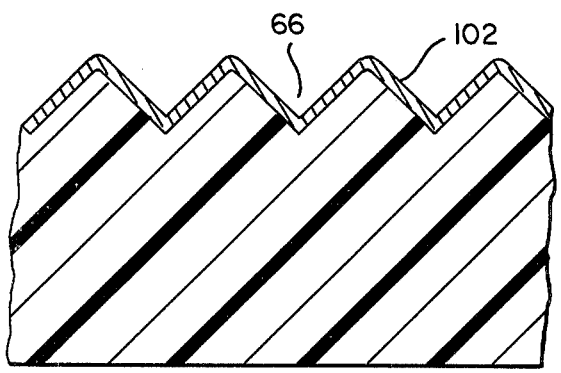
Figure 8:
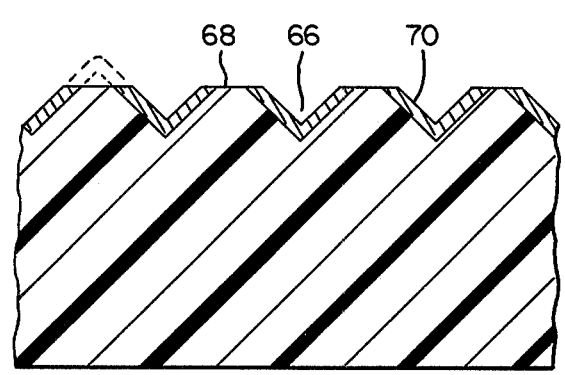

Connector 60 may be fabricated as shown in FIGS. 6 to 8, to which reference is now made. A base member 62 of the insulating material has a series of V-grooves 66 formed therein of a depth equal to approximately ¾ of the diameter of the conductors 76, 82. The grooves 66 will be symmetrical about the bisector 96 of the root 98 of the V-groove and the walls 100 defining the groove 66 will be at an angle of 45 degrees from the bisector 96. A layer 102 of conductive metal such as gold, silver, etc. is next applied over the entire V-grooved surface of the base member 62, as is evident in FIG. 7. Conductive layer 102 may be electroplated on base member 62, deposited by vapor deposition, painted on, applied by pressure-sensitive adhesive-backed foils, etc. Next, the intersections between adjacent grooves 66 are removed by machining, milling, etc. to leave insulating bands 68 which electrically isolate adjacent V-grooves 66 from one another. If desired, protruding ridges 104 can be formed in the grooves 66 better grip the conductors 76, 82 and prevent same from being withdrawn from the connector 60.

While there have been shown and pointed out the fundamental novel features of the invention as applied to the preferred embodiments, it will be understood that various omissions and substitutions and changes of the form and details of the device illustrated and in their operation may be made by those skilled in the art, without departing from the spirit of the invention.

The embodiments of the invention in which an exclusive property or privilege is claimed are defined as follows:

1. A method of forming a multichannel connector for use in joining the conductors of at least two pairs of conductors, comprising the steps of:
   forming a plurality of elongate channels within a surface of an insulative base member;
   forming as part of said channels a pair of conductor receiving portions at opposite ends of each channel;
   applying a conductive layer to the surface of said base member and within said channels and within said conductor receiving portions; and
   selectively removing the conductive layer from portions of the base member surface between said channels and said conductor receiving portions.

2. The method of claim 1 wherein said conductive layer is applied by plating a conductive material thereon.

3. The method of claim 1 wherein said conductive layer is applied by vapor depositing a conductive material thereon.

4. The method of claim 1 wherein said conductive layer is selectively removed by machining the surface of said insulating member comprising said conductive layer.

5. The method of claim 1 wherein the channels are formed in substantially V-shaped configuration, the plurality of such channels being formed substantially parallel to each other and in spaced disposition such that adjacent walls of such V-shaped channels define apexes therebetween.

6. The method of claim 5 wherein the channels and each of the apexes between adjacent V-shaped channels are initially covered with said conductor layer and subsequently said apexes containing such layer are removed thereby providing a discontinuity in the conductive layer between said channels.

7. A method of connecting conductors of two multiconductor cables comprising the steps of:
   forming a plurality of channels within surface of an insulated base;
   applying a conductive layer to the surface of said base member and within said channels;
   selectively removing the conductive layer from portions of said base member surface between channels;
   placing a bared conductor of each of said multiconductor cable in a channel of said base member; and
   placing an insulated cover over said base member, thereby insulating said placed bared conductors of said multiconductor cables.

8. The method of claim 7 wherein said bared conductors are placed in said channel of said base member in a coaxial orientation.

9. The method of claim 7 wherein said step of applying said conductive layer comprises plating a conductive material thereon.

10. The method of claim 7 wherein said step of applying said conductive layer comprises vapor depositing of a conductive material thereon.

11. The method of claim 7 wherein said step of selectively removing the conductive layer comprising machining the portion of said base member surface between said channels.

12. A method of forming a multichannel connector for joining the conductors of two multiconductor cables comprising the steps of: forming a series of contiguous V-grooves in the surface of an insulating base member; depositing a conductive layer over the entire surface of said insulating base member; removing the apexes of the bands between each V-groove to provide a series of isolated V-grooves; placing an insulating cover over said base member and fastening said cover to said base member to apply a compressive force to conductors placed in said channels.

13. The method of claim 12 including the further step of forming protruding ridges in the side walls of said V-grooves to grip the conductors placed therein.

14. The method of claim 12 wherein two sets of protruding ridges are placed in each V-groove.

* * * * *